(12) United States Patent
Lee et al.

(10) Patent No.: US 12,457,888 B2
(45) Date of Patent: Oct. 28, 2025

(54) DISPLAY DEVICE

(71) Applicant: Samsung Display Co., LTD., Yongin-si (KR)

(72) Inventors: Jaehun Lee, Seongnam-si (KR); Hye Sun Kim, Goyang-si (KR); Junho Sim, Hwaseong-si (KR); Sanghyun Lee, Hwaseong-si (KR); Yang-Ho Jung, Seoul (KR); Pil Soon Hong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 513 days.

(21) Appl. No.: 18/074,645

(22) Filed: Dec. 5, 2022

(65) Prior Publication Data

US 2023/0189559 A1    Jun. 15, 2023

(30) Foreign Application Priority Data

Dec. 9, 2021    (KR) .......................... 10-2021-0175884

(51) Int. Cl.
   *H10K 59/80*  (2023.01)
   *H10K 59/121* (2023.01)
   *H10K 59/126* (2023.01)

(52) U.S. Cl.
   CPC ....... *H10K 59/8792* (2023.02); *H10K 59/126* (2023.02); *H10K 59/879* (2023.02); *H10K 59/121* (2023.02)

(58) Field of Classification Search
   CPC ... H10H 29/30–49; H10K 59/12–1315; H10K 59/8792
   See application file for complete search history.

(56) References Cited

U.S. PATENT DOCUMENTS

| | | |
|---|---|---|
| 2010/0271721 A1 | 10/2010 | Gaides et al. |
| 2021/0217831 A1 | 7/2021 | Jung et al. |
| 2022/0416001 A1* | 12/2022 | Kim .................... H04M 1/0266 |

FOREIGN PATENT DOCUMENTS

| | | |
|---|---|---|
| CN | 113130538 A | 7/2021 |
| KR | 1020020037443 A | 5/2002 |
| KR | 1020180084333 A | 7/2018 |
| KR | 1020200063591 A | 6/2020 |
| KR | 1020200075597 A | 6/2020 |
| KR | 1020210028170 A | 3/2021 |
| KR | 1020210092351 A | 7/2021 |

* cited by examiner

*Primary Examiner* — Daniel P Shook
(74) *Attorney, Agent, or Firm* — CANTOR COLBURN LLP

(57) ABSTRACT

A display device includes a plurality of first light blocking patterns, a first substrate on the first light blocking patterns, a plurality of second light blocking patterns on the first substrate, a driving device on the plurality of second light blocking patterns, a via insulating layer on the driving device and defining a plurality of light blocking areas, and a light emitting device on the via insulating layer, electrically connected to the driving device and including a light emitting area.

20 Claims, 15 Drawing Sheets

DISPLAY DEVICE

This application claims priority to Korean Patent Application No. 10-2021-0175884 filed on Dec. 9, 2021, and all the benefits accruing therefrom under 35 U.S.C. § 119, the entire disclosure of which is incorporated herein by reference.

BACKGROUND

1. Field

The present disclosure relates to a display device. More particularly, the present disclosure relates to a display device capable of displaying an image.

2. Description of the Related Art

Display devices are manufactured and used in various ways. The display devices may display light to provide visual information to a user. Such a display device may include a liquid crystal display device that emits light using a liquid crystal layer, an inorganic light emitting display device that emits light using an inorganic light emitting diode, and an organic light emitting display device that emits light using an organic light emitting diode.

The display devices may be applied in various ways and used in various places. For example, the display device may be applied to a smart phone, a tablet, a laptop computer, a desktop, an air conditioner, a refrigerator, a vehicle, and the like. Many studies are being conducted to improve the visibility of the display devices used in various ways.

SUMMARY

One or more embodiment of the present disclosure provides a display device including light blocking materials.

However, embodiments of the present disclosure are not limited and may be variously expanded without departing from the spirit and scope of the present disclosure.

One or more embodiment provides a display device including a plurality of first light blocking patterns, a first substrate on the first light blocking patterns, a plurality of second light blocking patterns on the first substrate, a driving device on the second light blocking patterns, a via insulating layer on the driving device and including a plurality of light blocking areas, and a light emitting device on the via insulating layer, electrically connected to the driving device and including a light emitting area.

According to an embodiment, the via insulating layer may include a first via insulating layer on the driving device, and a second via insulating layer on the first via insulating layer.

According to an embodiment, the plurality of first light blocking patterns, the plurality of second light blocking patterns, and the plurality of light blocking areas may overlap each other, and the light emitting areas may be spaced apart from or adjacent to the plurality of light blocking areas in a plan view.

According to an embodiment, the display device may further include a plurality of third light blocking patterns between the first substrate and the plurality of second blocking patterns, and a second substrate between the plurality of second light blocking patterns and the plurality of third light blocking patterns, and including polyimide.

According to an embodiment, the plurality of third light blocking patterns may overlap the plurality of light blocking areas.

According to an embodiment, each of the plurality of first light blocking patterns and the plurality of second light blocking patterns may include a conductive material, a black pigment, or a black dye.

According to an embodiment, the plurality of light blocking areas may include a black pigment or a black dye.

According to an embodiment, a first length of the light emitting area in a first direction taken along the via insulating layer may be equal to or greater than a second length of each of the plurality of light blocking areas in the first direction, in a sectional view.

According to an embodiment, a third length of each of the plurality of light blocking areas in a second direction crossing the first direction (e.g., a thickness direction of the display device), may be about a half or more of the first length.

According to an embodiment, the first substrate may include polyimide.

According to an embodiment, the via insulating layer may be overlap the light emitting area and may include a refractive pattern having a refractive index higher than a refractive index of a portion of the via insulating layer forming a boundary with the refractive pattern.

According to an embodiment, the refractive pattern may have a semicircular shape or a trapezoidal shape.

According to an embodiment, the light emitting device may include a bottom light emitting type light emitting device.

One or more embodiment provides a display device including a plurality of first light blocking patterns, a first substrate on the first light blocking patterns and including polyimide, a plurality of second light blocking patterns on the first substrate, a driving device on the second light blocking patterns, a via insulating layer on the driving device and including a plurality of light blocking areas, and a light emitting device on the via insulating layer, electrically connected to the driving device, and including a light emitting area. The plurality of first light blocking patterns, the plurality of second light blocking patterns, and the plurality of light blocking areas overlap each other, and the light emitting area is spaced apart from or adjacent to the plurality of light blocking areas in a plan view.

According to an embodiment, the via insulating layer may include a first via insulating layer on the driving device, and a second via insulating layer on the first via insulating layer.

According to an embodiment, the display device may further include a plurality of third light blocking patterns between the first substrate and the plurality of second blocking patterns and overlapping the plurality of light blocking areas, and a second substrate between the plurality of second light blocking patterns and the plurality of third light blocking patterns, and including polyimide.

According to an embodiment, each of the plurality of first light blocking patterns, the plurality of second light blocking patterns, and the plurality of third light blocking patterns may include a conductive material, a black pigment, or a black dye, and the plurality of light blocking areas may include a black pigment or a black dye.

According to an embodiment, the via insulating layer may overlap the light emitting area and may include a refractive pattern having a refractive index higher than a refractive index of a portion of the via insulating layer which forms a boundary with the refractive pattern, and the refractive pattern may have a semicircular shape or a trapezoidal shape.

According to an embodiment, a first length of the light emitting area in a first direction taken along the via insulating layer, may be equal to or greater than a second length of each of the plurality of light blocking areas in the first direction, in a sectional view.

According to an embodiment, a third length of each of the plurality of light blocking areas in a second direction crossing the first direction (e.g., a thickness direction of the display device) may be about a half or more of the first length.

The display device according to one or more of the embodiments of the present disclosure may include a plurality of light blocking patterns, and a light blocking area can be defined in (or by) an insulating layer. The plurality of light blocking patterns may include a black pigment, a black dye, or a conductive material. The light blocking areas can be formed by patterning a black pigment or a black dye on (or in) an organic insulating material.

As described above, since the display device includes components that perform various light blocking functions, the viewing angle of light emitted from bottom light emitting type light emitting devices can be narrowed, so that the light can be emitted to outside the display device only in a desired direction.

However, the effect of the present disclosure is not limited to the above-described effect, and may be variously extended without departing from the spirit and scope of the present disclosure.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
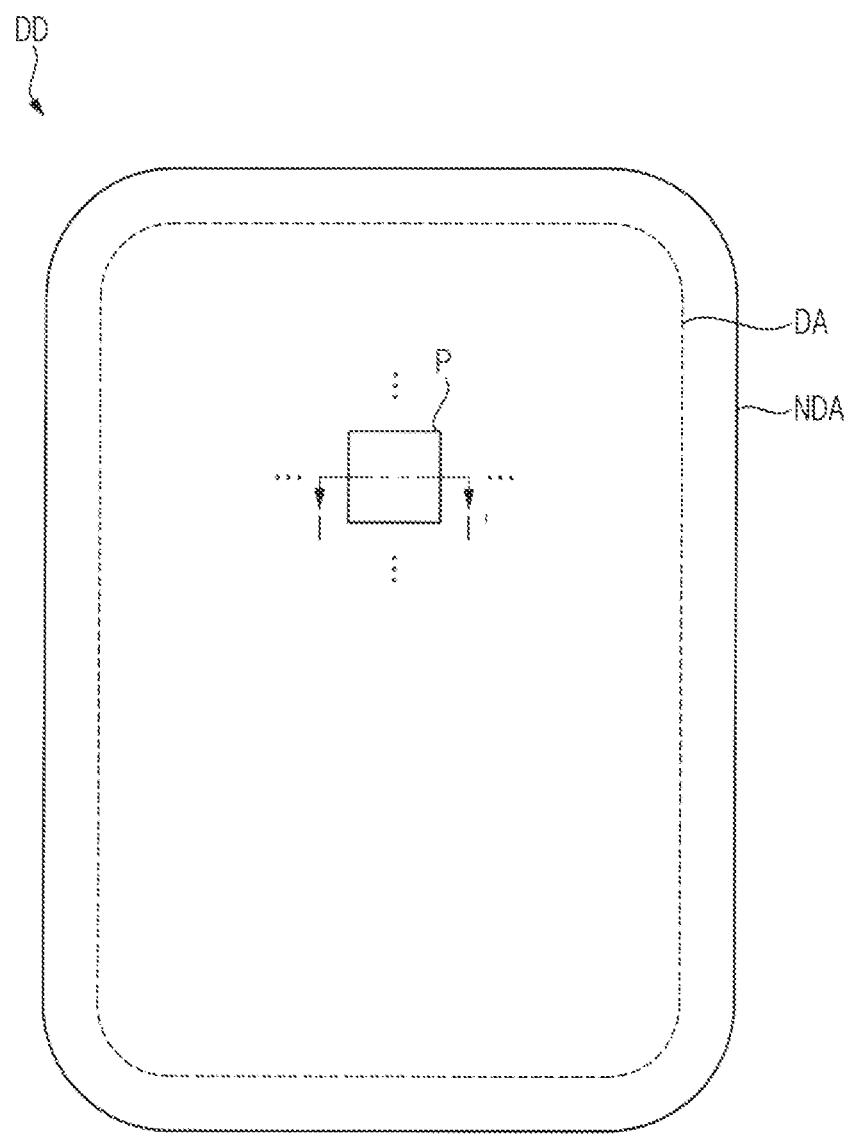
FIG. 1 is a plan view illustrating a display device according to an embodiment of the present disclosure.

Hereinafter, embodiments of the present disclosure will be described in more detail with reference to the accompanying drawings. The same or similar reference numerals will be used for the same components in the accompanying drawings.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, a reference number may indicate a singular element or a plurality of the element. For example, a reference number labeling a singular form of an element within the drawing figures may be used to reference a plurality of the singular element within the text of specification.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device DD according to an embodiment of the present disclosure.

Referring to FIG. 1, a display device DD may include a display area DA and a non-display area NDA which is adjacent to the display area DA. The non-display area NDA may be disposed to surround the display area DA. In addition, the non-display area NDA may be disposed only on one side of the display area DA. The display area DA and the non-display area NDA may be disposed in a plane defined by a first direction and a second direction crossing each other, where horizontal and vertical directions in FIG. 1 may variously represent the first and/or second directions in a planar direction. A thickness direction of the display device DD may be defined along a third direction which crosses each of the first and second directions.

A pixel P provided in plural including a plurality of pixels P may be disposed in the display area DA. The plurality of pixels P may include a driving device (for example, a transistor, etc.) and a light emitting device (for example, an organic light emitting diode, etc.) which is connected to the driving device. The light emitting device may receive a signal from the driving device to emit light. Therefore, the display device DD may display an image by emitting light from the plurality of pixels P. To this end, the plurality of pixels P may be arranged along the display area DA. For example, the plurality of pixels P may be arranged in the display area DA in the form of a matrix.

A driving unit for driving the plurality of pixels P may be disposed in the non-display area NDA. The driving unit may include a data driver, a gate driver, a light emission driver, a power voltage generator, a timing controller, and the like. The plurality of pixels P may emit light based on signals received from the drivers.

Figure 2:
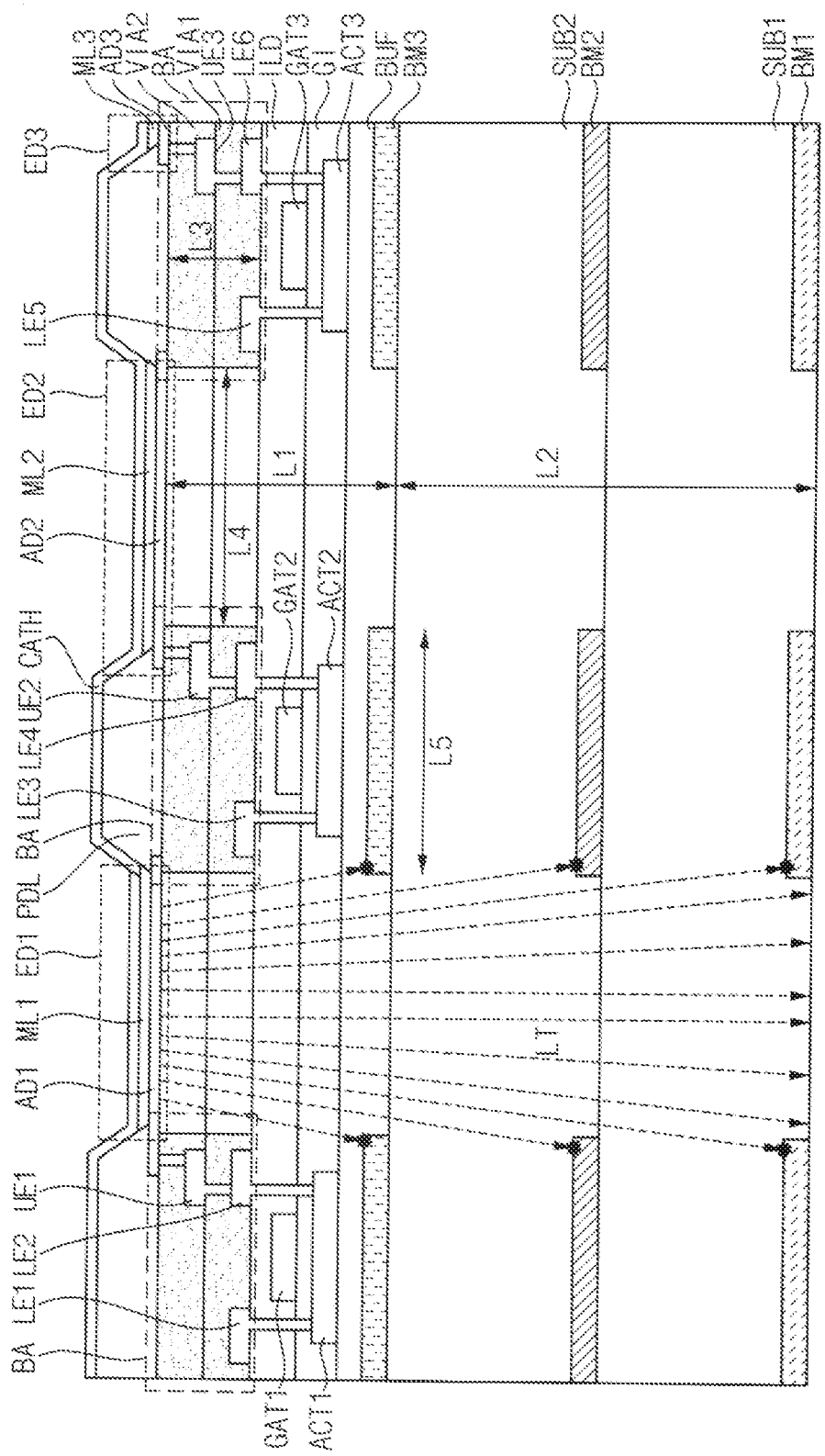
FIG. 2 is a sectional view illustrating an embodiment taken along line I-I' of the display device shown in FIG. 1.

FIG. 2 is a sectional view (e.g., cross-sectional view) illustrating an embodiment taken along line I-I' of the display device DD shown in FIG. 1.

Referring to FIGS. 1 and 2, the display device DD may include a plurality of first light blocking patterns BM1 in a first light blocking pattern layer, a first substrate SUB1 (e.g., a first substrate layer), a plurality of second light blocking patterns BM2 in a second light blocking pattern layer, a second substrate SUB2 (e.g., a second substrate layer), a plurality of third light blocking patterns BM3 in a third light blocking pattern layer, a buffer layer BUF, first to third active layers ACT1, ACT2 and ACT3 in an active layer, a gate insulating layer GI, first to third gate electrodes GAT1, GAT2, and GAT3 in a gate electrode layer, an interlayer insulating layer ILD, first to sixth lower electrodes LE1, LE2, LE3, LE4, LE5 and LE6 in a lower electrode layer, a first via insulating layer VIA1, first to third upper electrodes UE1, UE2 and UE3 in an upper electrode layer, a second via insulating layer VIA2, first to third anode electrodes AD1, AD2 and AD3 in an anode electrode layer (e.g., first electrode layer), a pixel defining layer PDL, first to third intermediate layers ML1, ML2 and ML3 in an intermediate pattern layer, and a cathode electrode CATH.

The first to third active layers ACT1, ACT2, and ACT3, the first to third gate electrodes GAT1, GAT2, and GAT3, and the first to sixth lower electrodes LE1, LE2, LE3, LE4, LE5, and LE6 may together (or respectively together) constitute a driving device.

The first anode electrode AD1, the first intermediate layer ML1, and the cathode electrode CATH may together constitute a first light emitting device ED1, the second anode electrode AD2, the second intermediate layer ML2, and the cathode electrode CATH may together constitute a second light emitting device ED2, and the third anode electrode AD3, the third intermediate layer ML3, and the cathode electrode CATH may together constitute a third light emitting device ED3. The first to third light emitting devices ED1, ED2, and ED3 may together constitute a light emitting device layer.

The first substrate SUB1 may include plastic. For example, the first substrate SUB1 may include polyimide, and thus the first substrate SUB1 may have flexibility.

The first substrate SUB1 may be disposed on (and facing) the plurality of first light blocking patterns BM1. The plurality of first light blocking patterns BM1 may be disposed spaced apart from each other in a direction along a respective substrate. The plurality of first light blocking patterns BM1 which are spaced apart from each other define a first gap between adjacent light blocking patterns. The plurality of first light blocking patterns BM1 may serve to block and/or absorb light. To this end, the plurality of first light blocking patterns BM1 may include a black pigment, a black dye, or a conductive material.

Examples of the material that can be used as the black pigment may include a carbon black and the like. However, the carbon black is an example only, and various materials having a light-blocking function may be used as the black pigment.

Examples of the conductive material may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), and scandium (Sc), indium tin oxide (ITO), and indium zinc oxide (IZO). The above elements may be used alone or in combination with each other.

The plurality of second light blocking patterns BM2 may be disposed on the first substrate SUB1, to face the first light blocking patterns BM1 with the first substrate SUB1 therebetween. The plurality of second light blocking patterns BM2 may be disposed to overlap (or correspond to) the plurality of first light blocking patterns BM1, along a thickness direction of the display device DD. That is, the plurality of second light blocking patterns BM2 may also be disposed to be spaced apart from each other to be spaced apart from each other by a second gap therebetween. The plurality of second light blocking patterns BM2 may also serve to block and/or absorb light. To this end, the plurality of second light blocking patterns BM2 may also include a black pigment, a black dye, or a conductive material. The plurality of first light blocking patterns BM1 and the plurality of second light blocking patterns BM2 may be formed of (or include) the same material as each other or different materials from each other.

The second substrate SUB2 maybe disposed on the first substrate SUB1 while covering the plurality of second light blocking patterns BM2. The second substrate SUB2 may include plastic. For example, the second substrate SUB2 may include polyimide, and thus the second substrate SUB2 may have flexibility.

The plurality of third light blocking patterns BM3 may be disposed on the second substrate SUB2. The plurality of third light blocking patterns BM3 may be disposed to overlap the plurality of first light blocking patterns BM1 and the plurality of second light blocking patterns BM2. That is, the plurality of third light blocking patterns BM3 may also be disposed to be spaced apart from each other to be spaced apart from each other by a second gap therebetween. The plurality of third light blocking patterns BM3 may be respectively aligned with the plurality of first light blocking patterns BM1 and the plurality of second light blocking patterns BM2 along the thickness direction. The first gap, the second gap and the third gap may also be aligned with each other along the thickness direction. The plurality of third light blocking patterns BM3 may also serve to block and/or absorb light. To this end, the plurality of third light blocking patterns BM3 may also include a black pigment, a black dye, or a conductive material. The plurality of first light blocking patterns BM1, the plurality of second light blocking patterns BM2, and the plurality of third light blocking patterns BM3 may be formed of the same material or different materials.

The buffer layer BUF may be disposed on the second substrate SUB2 while covering the plurality of third light blocking patterns BM3. The buffer layer BUF may include an inorganic insulating material. Examples of the material that can be used as the buffer layer BUF may include silicon oxide (SiOx), silicon nitride (SiNx), silicon oxynitride (SiON), and the like. The above elements may be used alone or in combination with each other. The buffer layer BUF may prevent metal atoms or impurities from diffusing into the active layers ACT1, ACT2, and ACT3. In addition, the buffer layer BUF may control the rate of heat provided to the first to third active layers ACT1, ACT2 and ACT3 during the crystallization process for forming the first to third active layers ACT1, ACT2, and ACT3.

The first to third active layers ACT1, ACT2, and ACT3 may be disposed on the buffer layer BUF. In embodiments, the first to third active layers ACT1, ACT2, and ACT3 may include a silicon semiconductor. Examples of materials that can be used as the first to third active layers ACT1, ACT2, and ACT3 may include amorphous silicon, polycrystalline silicon, and the like. Alternatively, in embodiments, the first to third active layers ACT1, ACT2, and ACT3 may include an oxide semiconductor. Examples of materials that may be used as the first to third active layers ACT1, ACT2, and ACT3 may include indium-gallium-zinc oxide (IGZO), indium-gallium oxide (IGO), indium-zinc oxide (IZO), and the like.

The gate insulating layer GI may be disposed on the buffer layer BUF. The gate insulating layer GI may be disposed while covering the first to third active layers ACT1, ACT2, and ACT3. The gate insulating layer GI may include an insulating material. Examples of the material that can be used as the gate insulating layer GI may include silicon oxide (SiOx), silicon nitride (SiNx), silicon oxynitride (SiON), and the like. The above elements may be used alone or in combination with each other.

The first to third gate electrodes GAT1, GAT2, and GAT3 may be disposed on the gate insulating layer GI. The first to third gate electrodes GAT1, GAT2, and GAT3 may partially overlap the first to third active layers ACT1, ACT2, and ACT3. A signal and/or a voltage (e.g., an electrical signal for controlling, driving, etc. elements of the display device DD) may be applied to the first to third active layers ACT1, ACT2, and ACT3 in response to a gate signal as an electrical signal provided to the first to third gate electrodes GAT1, GAT2, and GAT3. In an embodiment, the first to third gate electrodes GAT1, GAT2, and GAT3 may include a metal, an alloy, a metal oxide, a transparent conductive material, and the like. Examples of materials that can be used as the first to third gate electrodes GAT1, GAT2, and GAT3 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. The above elements may be used alone or in combination with each other.

The interlayer insulating layer ILD may be disposed on the gate insulating layer GI. The interlayer insulating layer ILD may be disposed while covering the first to third gate electrodes GAT1, GAT2, and GAT3. In an embodiment, the interlayer insulating layer ILD may include an insulating material. Examples of the material that can be used as the interlayer insulating layer ILD may include silicon oxide (SiOx), silicon nitride (SiNx), silicon oxynitride (SiON), and the like. The above elements may be used alone or in combination with each other.

The first to sixth lower electrodes LE1, LE2, LE3, LE4, LE5, and LE6 may be disposed on the interlayer insulating layer ILD. The first lower electrode LE1 and the second lower electrode LE2 may come into contact with the first active layer ACT1 through (or at) contact holes, respectively. The third lower electrode LE3 and the fourth lower electrode LE4 may come into contact with the second active layer ACT2 through contact holes, respectively. The fifth lower electrode LE5 and the sixth lower electrode LE6 may come into contact with the third active layer ACT3 through contact holes, respectively. As being in contact, elements may form an interface therebetween, without being limited thereto.

In an embodiment, each of the first to sixth lower electrodes LE1, LE2, LE3, LE4, LE5, and LE6 may include a metal, an alloy, a metal oxide, a transparent conductive material, and the like. Examples of materials that can be used as the first to sixth lower electrodes LE1, LE2, LE3, LE4, LE5, and LE6 may include silver (Ag), an alloy containing silver, molybdenum (Mo), and molybdenum. an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like.

The first via insulating layer VIA1 may be disposed on the interlayer insulating layer ILD. The first via insulating layer VIA1 may be disposed while covering the first to sixth lower electrodes LE1, LE2, LE3, LE4, LE5, and LE6. The first via insulating layer VIA1 may have a substantially flat top surface. In an embodiment, the first via insulating layer VIA1 may include an organic insulating material. Examples of the material that can be used as the first via insulating layer VIA1 may include photoresist, polyacrylic resin, polyimide resin, acrylic resin, and the like. The above elements may be used alone or in combination with each other.

The first to third upper electrodes UE1, UE2, and UE3 may be disposed on the first via insulating layer VIAL The first upper electrode UE1 may be connected to the second lower electrode LE2 through a contact hole, the second upper electrode UE2 may be connected to the fourth lower electrode LE4 through a contact hole, and the third upper electrode UE3 may be connected to the sixth lower electrode LE6 through a contact hole. As being connected, elements may be electrically connected directly or indirectly to each other, may contact each other, etc.

The second via insulating layer VIA2 may be disposed on the first via insulating layer VIA1 while covering the first to third upper electrodes UE1, UE2, and UE3. The second via insulating layer VIA2 may have a substantially flat top surface. In an embodiment, the second via insulating layer VIA2 may include an organic insulating material. Examples of the material that can be used as the second via insulating layer VIA2 may include photoresist, polyacrylic resin, polyimide resin, acrylic resin, and the like. The above elements may be used alone or in combination with each other.

The first via insulating layer VIA1 and the second via insulating layer VIA2 may include (or define) respective layers of a plurality of light blocking areas BA. The display device DD may include the via insulating layer including one or more of the first via insulating layer VIA1 and the second via insulating layer VIA2, defining the plurality of light blocking areas BA in the via insulating layer. In an embodiment, the via insulating layer is provided in plural including in order from the driving device a first via insulating layer VIA1 including a first light blocking layer respectively defined at the plurality of light blocking areas BA, and a second via insulating layer VIA2 including a second light blocking layer respectively defined at the plurality of light blocking areas BA and aligned with the first light blocking layer of the first via insulating layer. The plurality of light blocking areas BA may be disposed to overlap the first to third light blocking patterns BM1, BM2, and BM3.

The plurality of light blocking areas BA may be formed (or provided) by patterning a black pigment or a black dye on (or in) the organic insulating material. The plurality of light blocking areas BA in the via insulating layer may include a first light blocking layer defined by light blocking portions of the first via insulating layer VIA1 and a second light blocking layer defined by light blocking portions of the second via insulating layer VIA2.

The first to third anode electrodes AD1, AD2, and AD3 may be disposed on the second via insulating layer VIA2. The first anode electrode AD1 may be connected to the first upper electrode UE1 through a contact hole, the second anode electrode AD2 may be connected to the second upper electrode UE2 through a contact hole, and the third anode electrode AD3 may be connected to the third upper electrode UE3 through a contact hole.

The pixel defining layer PDL may be disposed on the first to third anode electrodes AD1, AD2, and AD3 and may define respective openings for exposing the first to third anode electrodes AD1, AD2, and AD3 to outside the pixel defining layer PDL. The pixel defining layer PDL may serve to partition each of the light emitting devices ED1, ED2, and ED3 in a direction along a substrate. In an embodiment, the pixel defining layer PDL may include an organic insulating material. Examples of materials that can be used as the pixel defining layer PDL may include photoresists, polyacrylic resins, polyimide resins, acrylic resins, and the like.

The first to third intermediate layers ML1, ML2, and ML3 may be disposed on the first to third anode electrodes AD1, AD2, and AD3, respectively. The first to third intermediate layers ML1, ML2, and ML3 may include an organic material that emits light having a predetermined color. The first to third intermediate layers ML1, ML2, and ML3 may respectively emit the light based on a potential difference (e.g., electrical potential difference) between the first to third anode electrodes AD1, AD2, and AD3, and the cathode electrode CATH which respectively faces each of the first to third anode electrodes AD1, AD2, and AD3 with the first to third intermediate layers ML1, ML2, and ML3 therebetween. To this end, each of the first to third intermediate layers ML1, ML2, and ML3 may include an electron injection layer, an electron transport layer, a light emitting layer, a hole transport layer, and a hole injection layer.

The cathode electrodes CATH may be commonly disposed on the first to third intermediate layers ML1, ML2, and ML3 and the pixel defining layer PDL.

In embodiments, the first to third light emitting devices ED1, ED2, and ED3 may have a bottom light emitting type structure. To this end, the first to third anode electrodes AD1, AD2, and AD3 may correspond to a transmissive electrode, and the cathode electrode CATH may correspond to a reflective electrode. Accordingly, light LT which is respectively emitted from the first to third intermediate layers ML1, ML2, and ML3 may be discharged to outside the first to third light emitting devices ED1, ED2, and ED3 by passing through the first to third anode electrodes AD1, AD2, and AD3, and toward the light blocking pattern layers and the substrate layers. A light emission direction is defined from the first to third light emitting devices ED1, ED2, and ED3, to the light blocking pattern layers, along a thickness direction of the display device DD. In an embodiment, a portion of the first substrate SUB1 is between the plurality of first light blocking patterns BM1 of the first light blocking pattern layer, and light is emitted from the light emitting device and transmitted to outside the display device DD, in order, through the via insulating layer, between the plurality of second light blocking patterns BM2 of the second light blocking pattern layer, and through the portion of the first substrate SUB1 which is between the plurality of first light blocking patterns BM1 of the first light blocking pattern layer, without being limited thereto.

The first to third anode electrodes AD1, AD2, and AD3 may include a transparent conductive oxide. Examples of the material that can be used as the transparent conductive oxide may include indium tin oxide (ITO), indium zinc oxide (IZO), zinc oxide (ZnO), aluminum zinc oxide (AZO), indium oxide (In2O3), and the like, and the above elements may be used alone or in combination with each other. The cathode electrode CATH may include at least one of magnesium (Mg), silver (Ag), gold (Au), calcium (Ca), lithium (Li), chromium (Cr), copper (Cu) and aluminum (Al), or an alloy thereof.

A portion of the light LT emitted from the first to third light emitting devices ED1, ED2, and ED3 may not be discharged to the outside of the display device DD by the light blocking function of the plurality of light blocking areas BA and the plurality of first to third light blocking patterns BM1, BM2 and BM3. In this manner, the display device DD according to an embodiment narrows the viewing angle by using the plurality of light blocking areas BA and the plurality of first to third light blocking patterns BM1, BM2, and BM3, thereby allowing the light LT to be emitted from the display device DD and to outside thereof, only at a desired angle.

A length or distance from a lower surface of the buffer layer BUF which is closest to the substrate structure, to an upper surface of the second via insulating layer VIA2 which is furthest from the substrate structure, may be defined as a first length L1 along a thickness direction. A length from a lower surface of the first substrate SUB1 to an upper surface of the second substrate SUB2 may be defined as a second length L2 along the thickness direction. A length from a lower surface of the first via insulating layer VIA1 to an upper surface of the second via insulating layer VIA2 may be defined as a third length L3 along the thickness direction.

A sum of the first length L1 and the second length L2 may represent a total thickness inclusive of the light blocking areas BA (e.g., the light blocking portions of the first via insulating layer VIA1 and the second via insulating layer VIA2 which overlap and are aligned with each other). The total thickness may include thicknesses of all layers from the light blocking areas BA through a lowermost surface of the lowest layer (e.g., a lower surface furthest from the light emitting devices and defined by the first substrate SUB1 and/or the first light blocking patterns BM1). Lower surfaces of a substrate layer and a light blocking pattern layer may be coplanar with each other to define the lowermost surface of the display device DD.

A distance between the plurality of light blocking areas BA may be defined as a fourth length L4 in a sectional view, along a first direction (and/or a second direction). A fourth length L4 may be defined as a length of a respective light emitting area, in a planar direction. A width of each of the first to third light blocking patterns BM1, BM2, and BM3 and the light blocking areas BA may be defined as a fifth length L5 along the planar direction. The display device DD may include a plurality of light emitting areas of a plurality of light emitting devices which are respectively between adjacent light blocking areas BA. In an embodiment, the light emitting areas of the plurality of light emitting devices may be spaced apart from or adjacent to the plurality of light blocking areas BA in a plan view.

In embodiments, the third length L3 along the thickness direction may be about a half or more of the fourth length L4 in a planar direction which crosses the thickness direction. In addition, the fourth length L4 may be greater than or substantially equal to the fifth length L5. Further, the sum of the first length L1 and the second length L2 may be about 2.6 to 3 times the fourth length L4.

For example, the sum of the first length L1 and the second length L2 may correspond to about 2.83 times the fourth length L4. In this case, the sum of the first length L1 and the second length L2 may be about 24 micrometers to about 30 micrometers, the first length L1 may be about 7 micrometers to about 10 micrometers, and the second length L2 may be about 17 micrometers to about 20 micrometers. In addition, the fourth length L4 may be about 8.48 micrometers to about 10.6 micrometers.

In the display device DD according to an embodiment, the viewing angle is narrowly adjusted only when the sum of the first length L1 and the second length L2 is greater than the fourth length L4 as the length corresponding to respective light emitting areas. For example, the viewing angle of the display device DD of FIG. 2 may be about 30 degrees.

Figure 3:
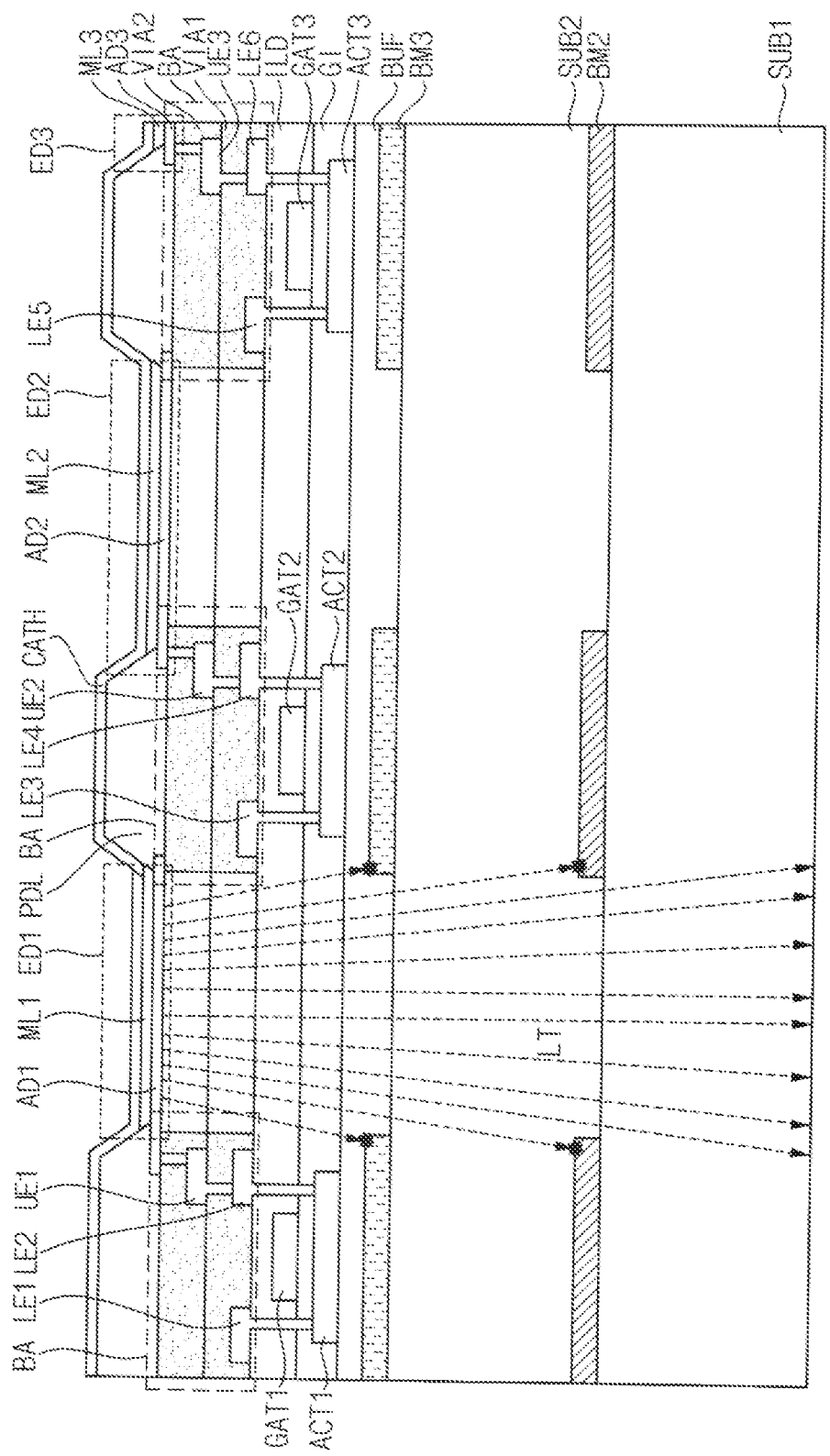
FIG. 3 is a sectional view illustrating an embodiment taken along line I-I' of the display device shown in FIG. 1.

FIG. 3 is a sectional view illustrating an embodiment taken along line I-I' of the display device shown in FIG. 1. FIG. 3 may be substantially the same as FIG. 2, except that the plurality of first light blocking patterns BM1 are not disposed (e.g., excluded). Accordingly, a description about the redundant elements will be omitted.

Figure 4:
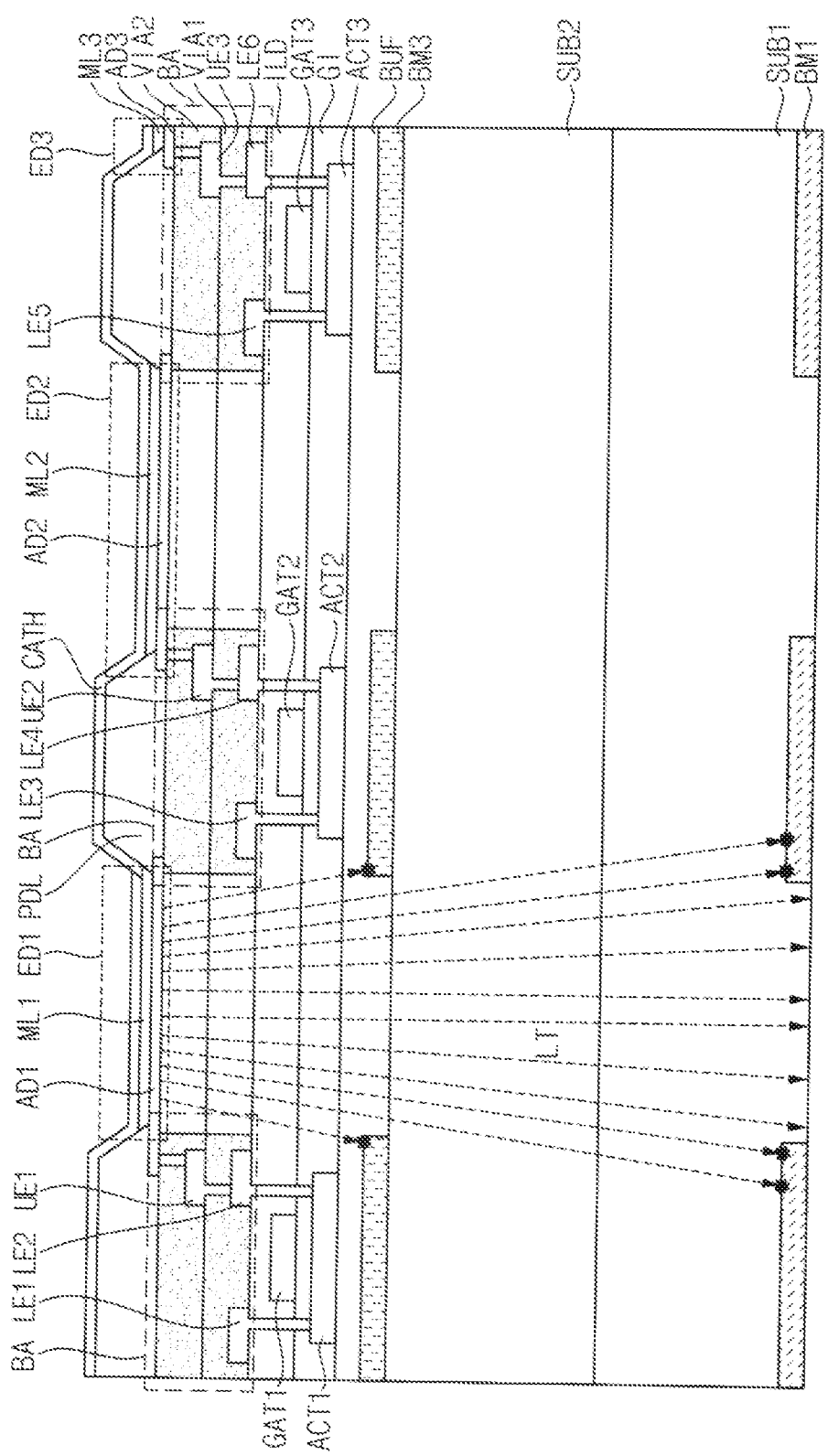
FIG. 4 is a sectional view illustrating an embodiment taken along line I-I' of the display device shown in FIG. 1.

FIG. 4 is a sectional view illustrating an embodiment taken along line I-I' of the display device shown in FIG. 1. FIG. 4 may be substantially the same as FIG. 2, except that the plurality of second light blocking patterns BM2 are not disposed. Accordingly, a description about the redundant elements will be omitted. The display device DD of FIG. 4 may have substantially the same viewing angle as the display device DD of FIG. 2 due to the plurality of first light blocking patterns BM1.

Figure 5:
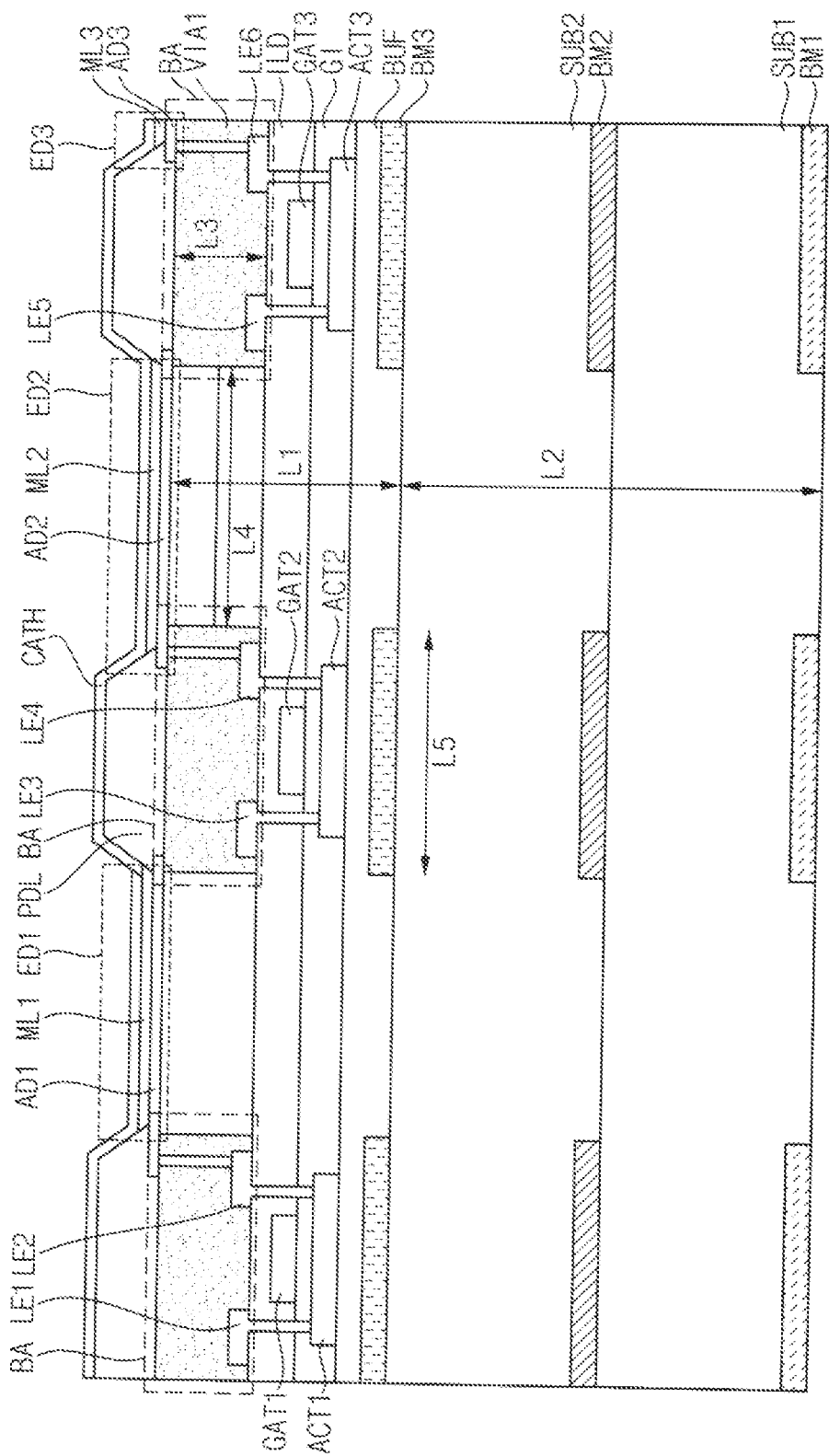
FIG. 5 is a sectional view illustrating an embodiment taken along line I-I' of the display device shown in FIG. 1.

FIG. 5 is a sectional view illustrating an embodiment taken along line I-I' of the display device shown in FIG. 1. FIG. 5 may be substantially the same as FIG. 2, except that the second via insulating layer VIA2 and the first to third upper electrodes UE1, UE2, and UE3 are not disposed. Accordingly, a description about the redundant elements will be omitted. Since only the first via insulating layer VIA1 is disposed in FIG. 5 and the light blocking layer is defined solely by the first via insulating layer VIA1, the first via insulating layer VIA1 is higher (e.g., thicker) than the first via insulating layer VIA1 shown in FIG. 2 to allow the plurality of light blocking areas BA to perform the light blocking function described above. Specifically, the first via insulating layer VIA1 is configured to have a third length L3 that is about a half or more of the fourth length L4.

Figure 6:
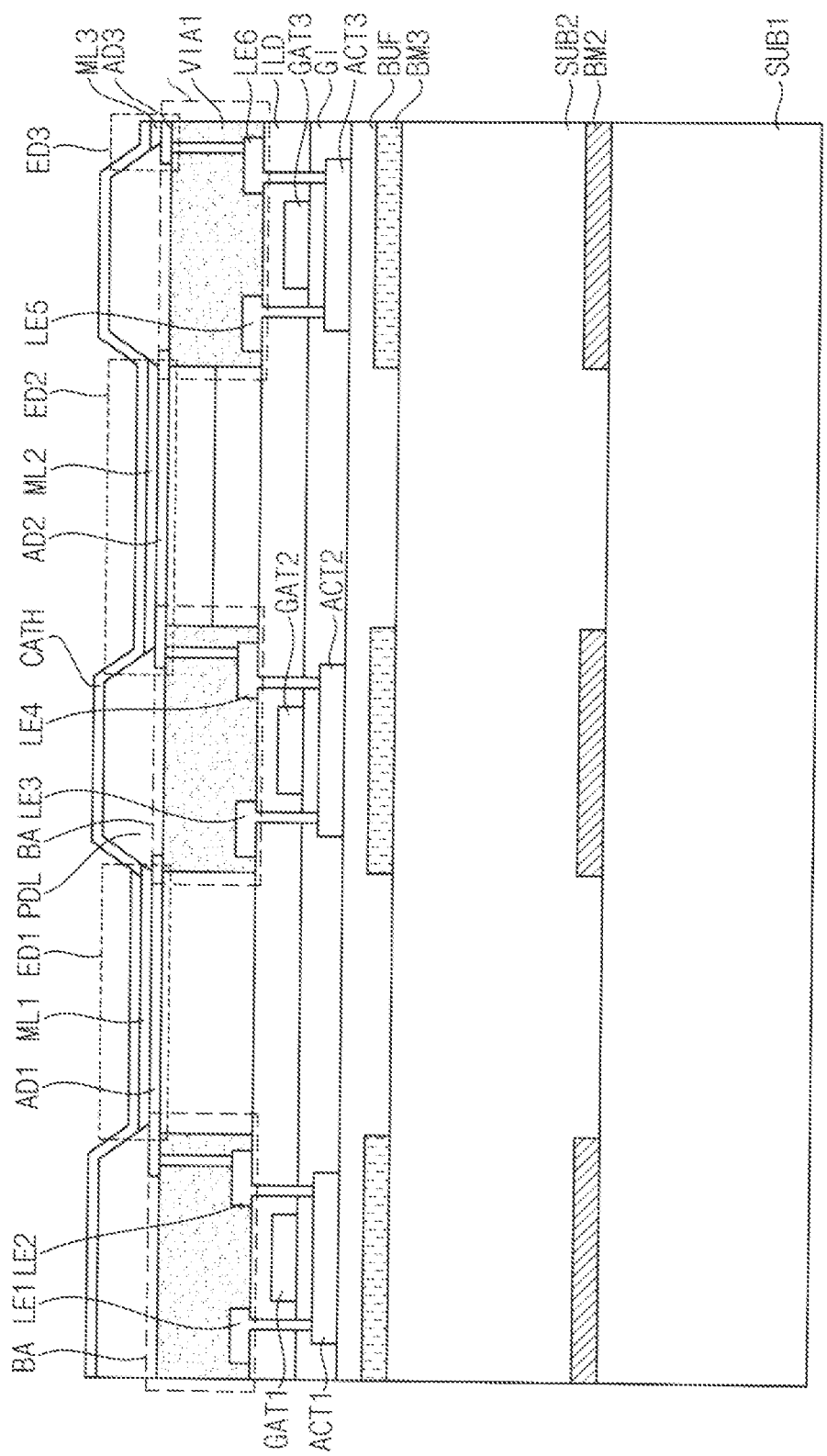
FIG. 6 is a sectional view illustrating an embodiment taken along line I-I' of the display device shown in FIG. 1.

FIG. 6 is a sectional view illustrating an embodiment taken along line I-I' of the display device shown in FIG. 1. FIG. 6 may be substantially the same as FIG. 5, except that the plurality of first light blocking patterns BM1 are not disposed. Accordingly, a description about the redundant elements will be omitted.

Figure 7:
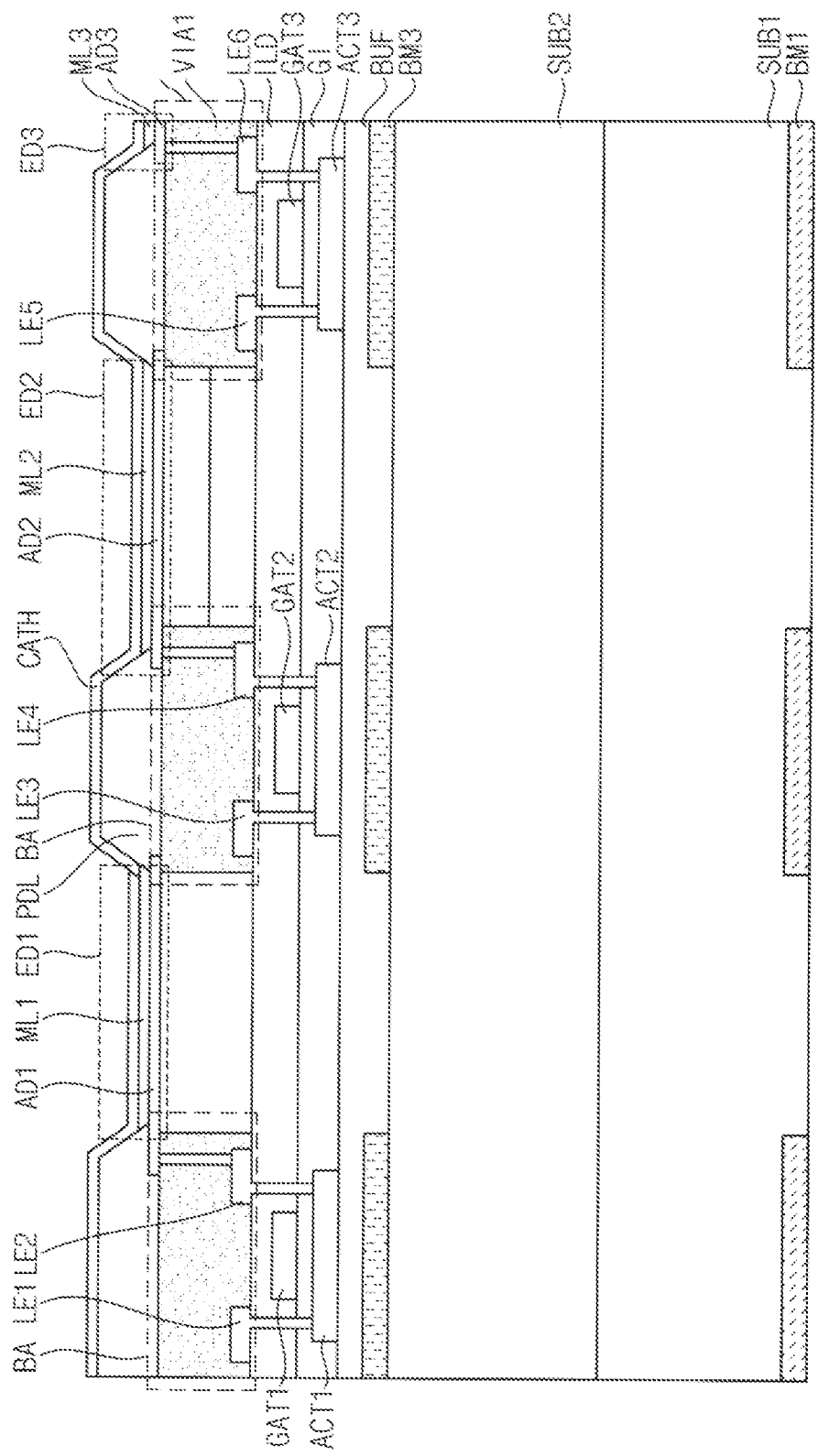
FIG. 7 is a sectional view illustrating an embodiment taken along line I-I' of the display device shown in FIG. 1.

FIG. 7 is a sectional view illustrating an embodiment taken along line I-I' of the display device shown in FIG. 1. FIG. 7 may be substantially the same as FIG. 5, except that the plurality of second light blocking patterns BM2 are not disposed. Accordingly, a description about the redundant elements will be omitted.

Figure 8:
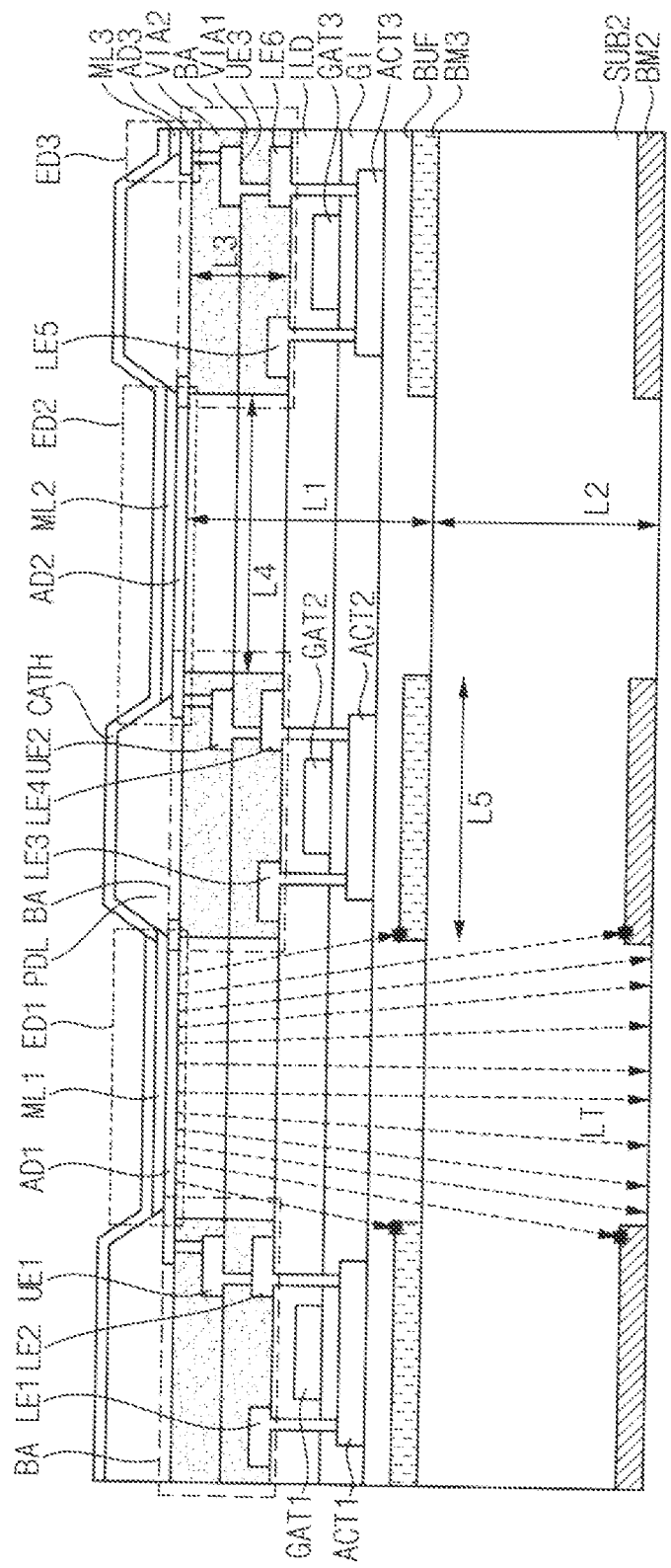
FIG. 8 is a sectional view illustrating an embodiment taken along line I-I' of the display device shown in FIG. 1.

FIG. 8 is a sectional view illustrating an embodiment taken along line I-I' of the display device shown in FIG. 1. FIG. 8 may be substantially the same as FIG. 2, except that the plurality of first light blocking patterns BM1 and the first substrate SUB1 are not disposed. Accordingly, a description about the redundant elements will be omitted. For example, the viewing angle of the display device DD of FIG. 8 may be about 45 degrees.

Referring to the layered structure of FIG. 8, the sum of the first length L1 and the second length L2 may be about 1.68 times to 2.08 times the fourth length L4. For example, when the fourth length L4 is about 10 micrometers, the sum of the first length L1 and the second length L2 may be about 18.8 micrometers.

Figure 9:
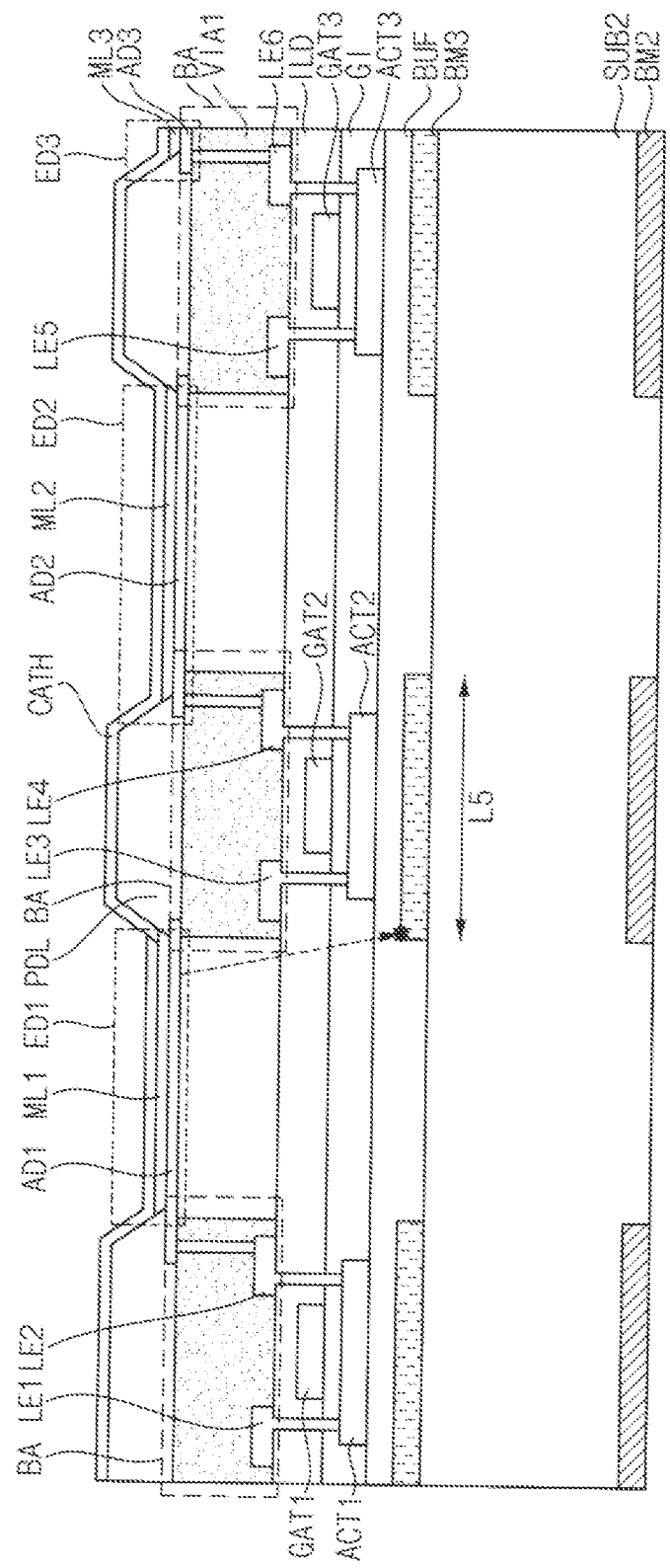
FIG. 9 is a sectional view illustrating an embodiment taken along line I-I' of the display device shown in FIG. 1.

FIG. 9 is a sectional view illustrating an embodiment taken along line I-I' of the display device shown in FIG. 1. FIG. 9 may be substantially the same as FIG. 8, except that the second via insulating layer VIA2 and the first to third upper electrodes UE1, UE2 and UE3 are not disposed. Accordingly, a description about the redundant elements will be omitted.

Figure 10:
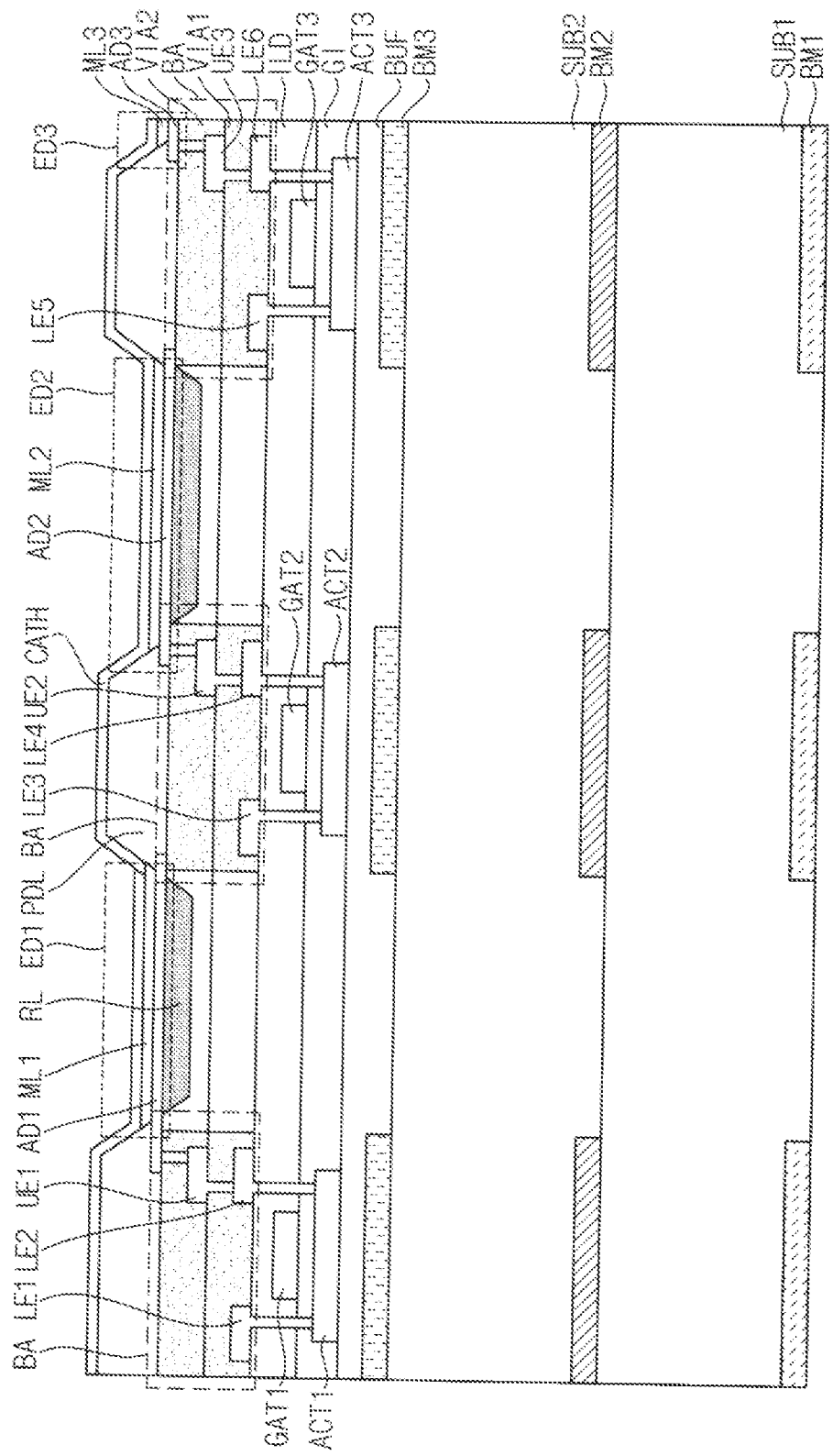
FIG. 10 is a sectional view illustrating an embodiment taken along line I-I' of the display device shown in FIG. 1.

FIG. 10 is a sectional view illustrating an embodiment taken along line I-I' of the display device shown in FIG. 1. FIG. 10 may be substantially the same as FIG. 2, except that a plurality of refractive patterns RL are added. Accordingly, a description about the redundant elements will be omitted.

Referring to FIGS. 1 and 10, the plurality of refractive patterns RL in a refractive pattern layer may have a trapezoidal shape. The plurality of refractive patterns RL may have a refractive index relatively higher than that of the second via insulating layer VIA2. For example, the refractive index of the second via insulating layer VIA2 may be less than about 1.5, and the refractive index of the plurality of refractive patterns RL may be about 1.5 to about 1.8. That is, the via insulating layer may include, corresponding to the light emitting area, portion having a first refractive index, and a refractive pattern RL forming a boundary with the portion having the first refractive index, the refractive pattern RL having a second refractive index higher than the first refractive index of the portion of the via insulating layer.

Accordingly, a path of light emitted from the first to third light emitting devices ED1, ED2, and ED3 may be adjusted in a vertical direction at a boundary between the second via insulating layer VIA2 and the refractive patterns RL.

Figure 11:
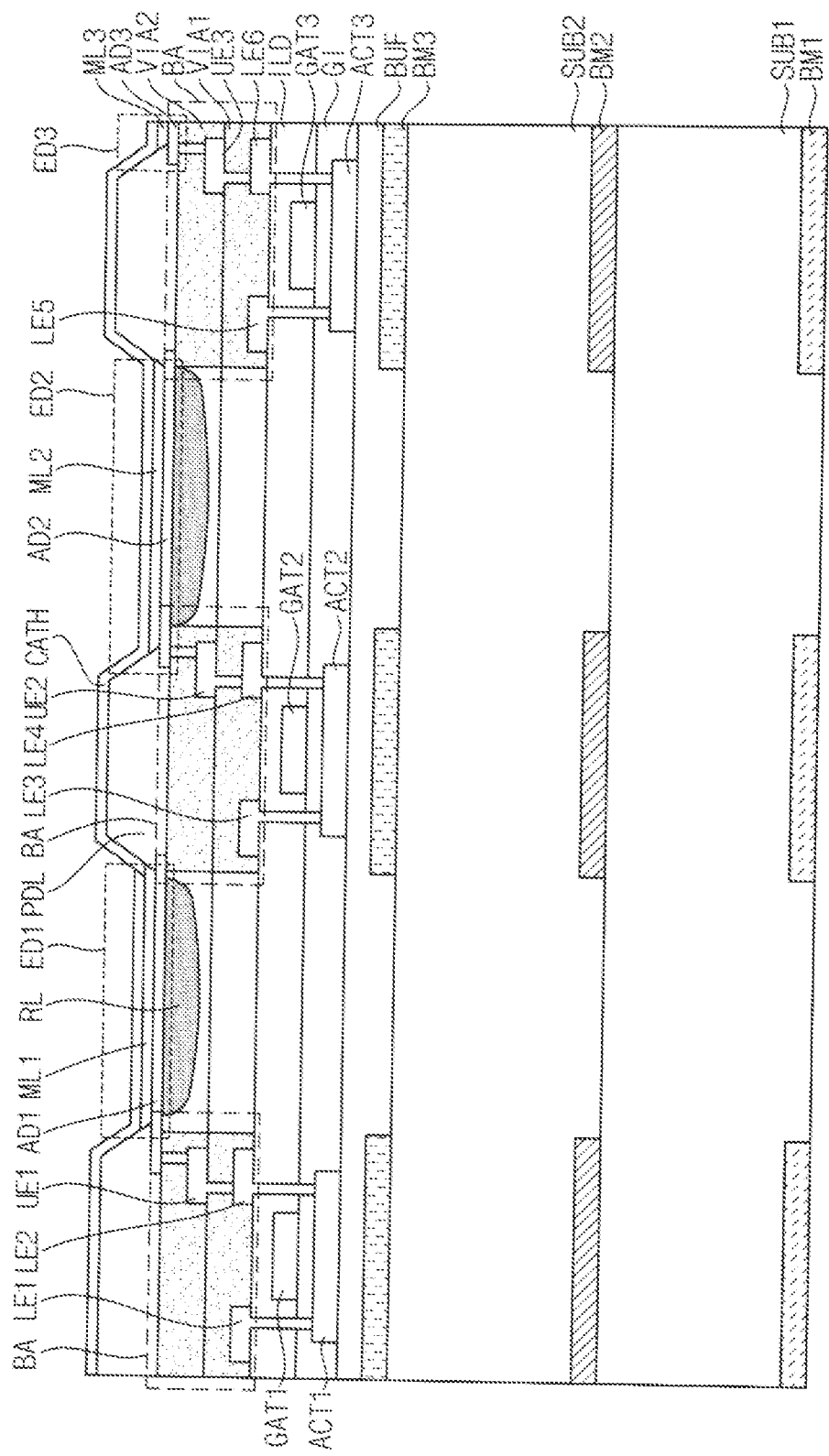
FIG. 11 is a sectional view illustrating an embodiment taken along line I-I' of the display device shown in FIG. 1.

FIG. 11 is a sectional view illustrating an embodiment taken along line I-I' of the display device shown in FIG. 1. FIG. 11 may be substantially the same as FIG. 10, except that the plurality of refractive patterns RL have a semicircular shape. Accordingly, a description about the redundant elements will be omitted.

Figure 12:
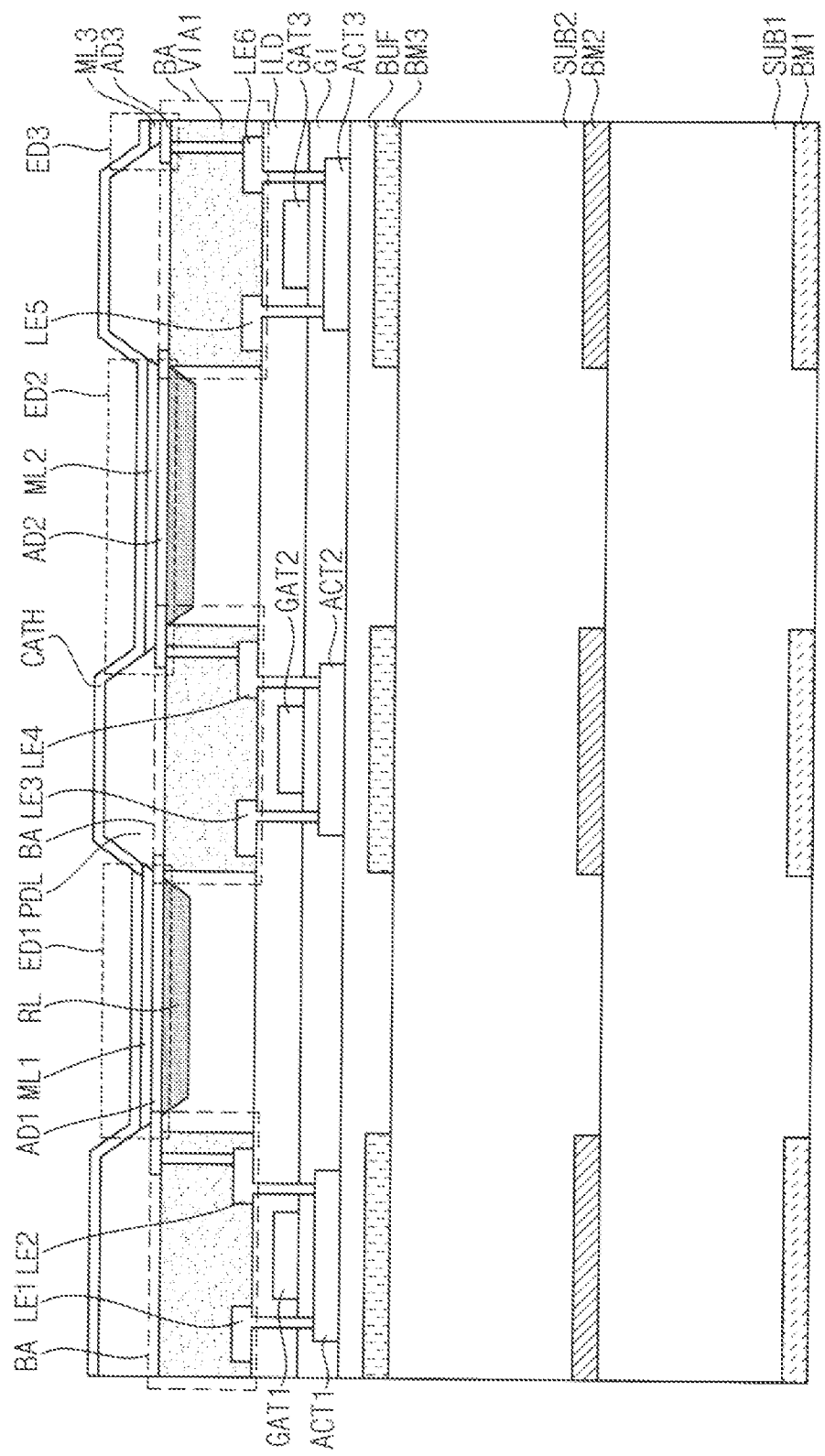
FIG. 12 is a sectional view illustrating an embodiment taken along line I-I' of the display device shown in FIG. 1.
Figure 13:
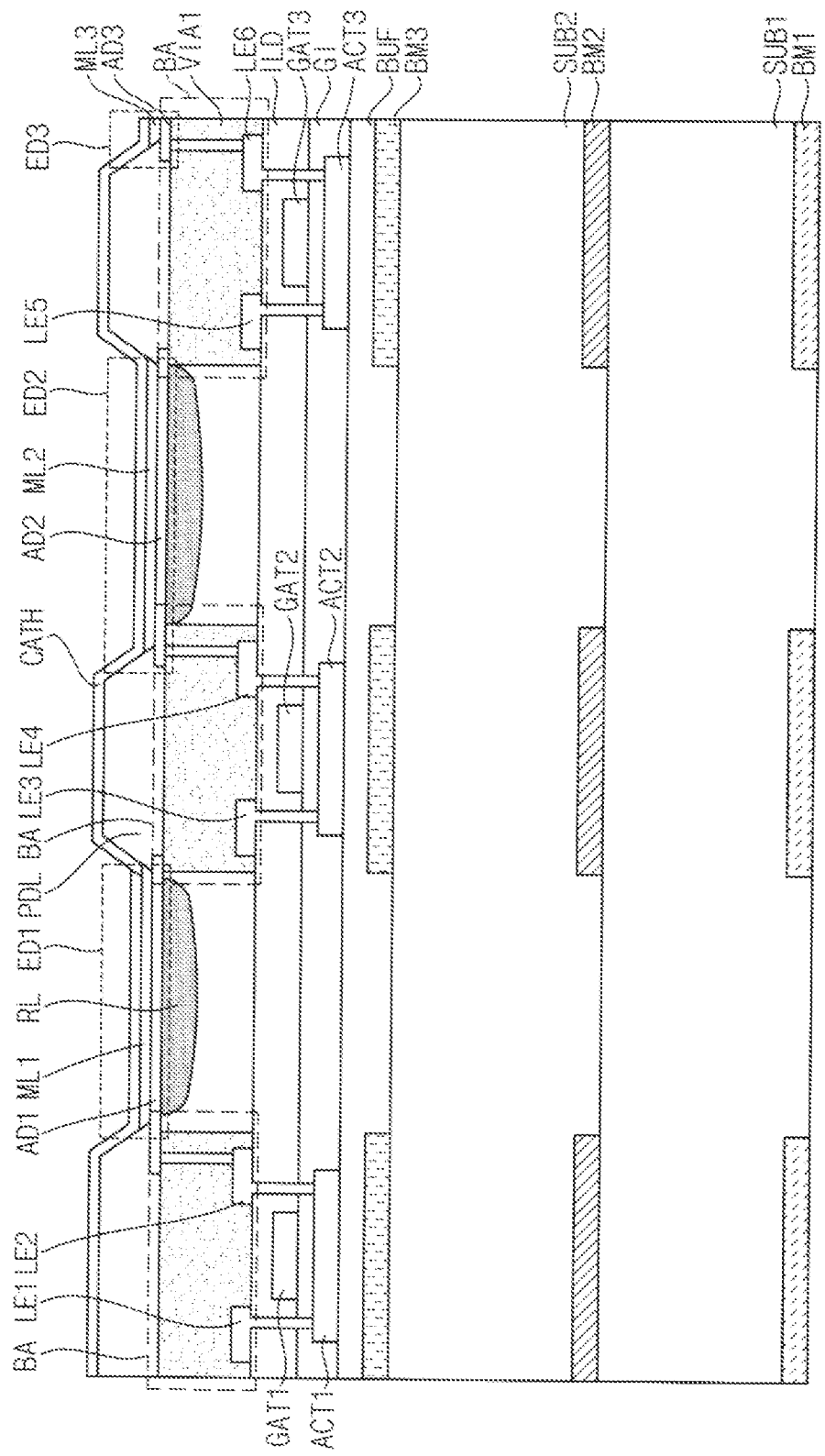
FIG. 13 is a sectional view illustrating an embodiment taken along line I-I' of the display device shown in FIG. 1.
Figure 14:
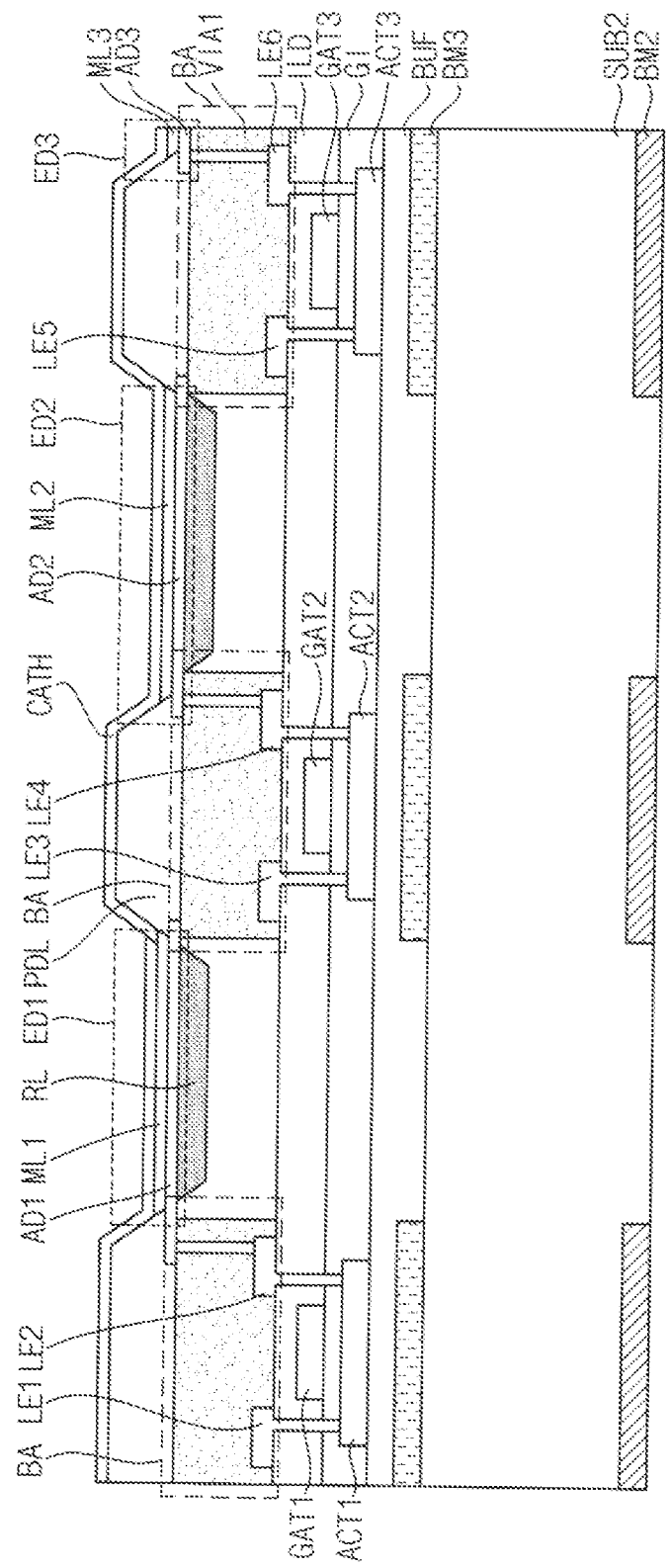
FIG. 14 is a sectional view illustrating an embodiment taken along line I-I' of the display device shown in FIG. 1.
Figure 15:
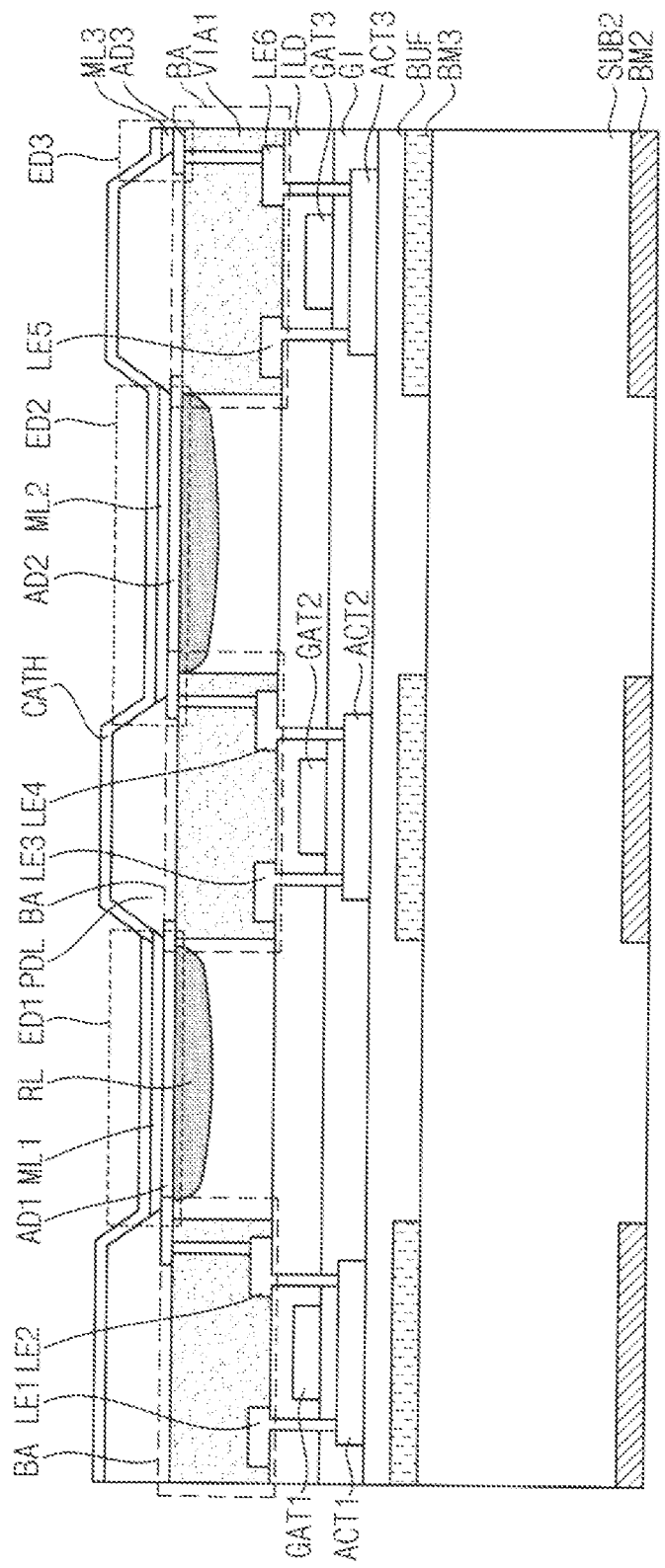
FIG. 15 is a sectional view illustrating an embodiment taken along line I-I' of the display device shown in FIG. 1.

FIG. 12 is a sectional view illustrating an embodiment taken along line I-I' of the display device shown in FIG. 1, FIG. 13 is a sectional view illustrating an embodiment taken along line I-I' of the display device shown in FIG. 1, FIG. 14 is a sectional view illustrating an embodiment taken along line I-I' of the display device shown in FIG. 1, and FIG. 15 is a sectional view illustrating an embodiment taken along line I-I' of the display device shown in FIG. 1.

FIGS. 12 to 15 may be substantially the same as the aforementioned drawings, except that a plurality of refractive patterns RL are added. Accordingly, a description about the redundant elements will be omitted.

The present disclosure has been described with reference to embodiments of the present disclosure. It be understood to those skilled in the art that various modifications and variations are possible without departing from the idea and scope of the present disclosure described in the claims.

The present disclosure can be applied to various display devices. For example, the present disclosure is applicable to various display devices such as display devices for vehicles, ships and aircraft, portable communication devices, display devices for exhibition or information transmission, medical display devices, and the like.

Although it has been described with reference to embodiments of the present disclosure, it will be understood to those skilled in the art that various modifications and variations are possible without departing from the idea and scope of the present disclosure described in the claims.

What is claimed is:

1. A display device comprising:
a first light blocking pattern layer including a plurality of first light blocking patterns;
a first substrate on the plurality of first light blocking patterns;
a second light blocking pattern layer including a plurality of second light blocking patterns on the first substrate;
a driving device on the plurality of second light blocking patterns;
a via insulating layer on the driving device and defining a plurality of light blocking areas in the via insulating layer; and
a light emitting device on the via insulating layer, electrically connected to the driving device, and including a light emitting area.

2. The display device of claim 1, wherein the via insulating layer is provided in plural including in order from the driving device:
a first via insulating layer including a first light blocking layer respectively defined at the plurality of light blocking areas; and
a second via insulating layer including a second light blocking layer respectively defined at the plurality of light blocking areas and aligned with the first light blocking layer of the first via insulating layer.

3. The display device of claim 1, wherein
the plurality of first light blocking patterns, the plurality of second light blocking patterns, and the plurality of light blocking areas are spaced apart from each other with a first gap, a second gap, and a third gap respectively therebetween, and
along a thickness direction of the display device:
the plurality of first light blocking patterns, the plurality of second light blocking patterns, the plurality of light blocking areas overlap each other,
the first gap, the second gap and the third gap are aligned with each other, and
the light emitting area corresponds to the first gap, the second gap and the third gap which are aligned with each other.

4. The display device of claim 3, further comprising:
a third light blocking pattern layer including a plurality of third light blocking patterns between the first substrate and the second light blocking pattern layer; and
a second substrate which is between the second light blocking pattern layer and the third light blocking pattern layer and includes polyimide.

5. The display device of claim 4, wherein along the thickness direction of the display device, the plurality of third light blocking patterns overlap the plurality of light blocking areas.

6. The display device of claim 1, wherein each of the plurality of first light blocking patterns and the plurality of second light blocking patterns includes a conductive material, a black pigment or a black dye.

7. The display device of claim 1, wherein within the via insulating layer, the plurality of light blocking areas include a black pigment or a black dye.

8. The display device of claim 1, wherein in a direction along the via insulating layer:
the light emitting area has a first length,
each of the plurality of light blocking areas has a second length, and
the first length of the light emitting area is equal to or greater than the second length of each of the plurality of light blocking areas.

9. The display device of claim 8, wherein
along a thickness direction, the via insulating layer has a third length at each of the plurality of light blocking areas, and the third length of the via insulating layer along the thickness direction is a half or more of the first length of the light emitting area in the direction along the via insulating layer.

10. The display device of claim 1, wherein the first substrate includes polyimide.

11. The display device of claim 1, wherein
the via insulating layer overlaps the light emitting area of the light emitting device, and
the via insulating layer includes, corresponding to the light emitting area:
a portion having a first refractive index, and
a refractive pattern forming a boundary with the portion having the first refractive index, the refractive pattern having a second refractive index higher than the first refractive index of the portion of the via insulating layer.

12. The display device of claim 11, wherein the refractive pattern of the via insulating layer has a semicircular shape or a trapezoidal shape.

13. The display device of claim 1, wherein
a portion of the first substrate is between the plurality of first light blocking patterns of the first light blocking pattern layer, and
light is emitted from the light emitting device and transmitted to outside the display device, in order, through the via insulating layer, between the plurality of second light blocking patterns of the second light blocking pattern layer, and through the portion of the first substrate which is between the plurality of first light blocking patterns of the first light blocking pattern layer.

14. A display device comprising:
a first light blocking pattern layer including a plurality of first light blocking patterns;
a first substrate on the plurality of first light blocking patterns and including polyimide;
a second light blocking pattern layer including a plurality of second light blocking patterns on the first substrate;
a driving device on the plurality of second light blocking patterns;
a via insulating layer on the driving device and defining a plurality of light blocking areas in the via insulating layer; and
a light emitting device on the via insulating layer, electrically connected to the driving device, and including a light emitting area,
wherein
the plurality of first light blocking patterns, the plurality of second light blocking patterns, and the plurality of light blocking areas are spaced apart from each other with a first gap, a second gap, and a third gap respectively therebetween, and
along a thickness direction of the display device:
the plurality of first light blocking patterns, the plurality of second light blocking patterns, the plurality of light blocking areas overlap each other,
the first gap, the second gap and the third gap are aligned with each other, and
the light emitting area corresponds to the first gap, the second gap and the third gap which are aligned with each other.

15. The display device of claim 14, wherein the via insulating layer is provided in plural including in order from the driving device:
a first via insulating layer including a first light blocking layer respectively defined at the plurality of light blocking areas; and
a second via insulating layer including a second light blocking layer respectively defined at the plurality of light blocking areas and aligned with the first light blocking layer of the first via insulating layer.

16. The display device of claim 14, further comprising:
a third light blocking pattern layer including a plurality of third light blocking patterns between the first substrate and the second light blocking pattern layer and respectively overlapping the plurality of light blocking areas; and
a second substrate which is between the second light blocking pattern layer and the third light blocking pattern layer and includes polyimide.

17. The display device of claim 16, wherein
each of the plurality of first light blocking patterns, the plurality of second light blocking patterns, and the plurality of third light blocking patterns includes a conductive material, a black pigment, or a black dye, and
the plurality of light blocking areas include a black pigment or a black dye.

18. The display device of claim 14, wherein
the via insulating layer overlaps the light emitting area of the light emitting device,
the via insulating layer includes, corresponding to the light emitting area:
a portion having a first refractive index, and
a refractive pattern forming a boundary with the portion having the first refractive index, the refractive pattern having a second refractive index higher than the first refractive index of the portion of the via insulating layer, and
the refractive pattern of the via insulating layer has a semicircular shape or a trapezoidal shape.

19. The display device of claim 14, wherein in a direction along the via insulating layer:
the light emitting area has a first length,
each of the plurality of light blocking areas has a second length, and
the first length of the light emitting area is equal to or greater than the second length of each of the plurality of light blocking areas.

20. The display device of claim 19, wherein
along a thickness direction, the via insulating layer has a third length at each of the plurality of light blocking areas, and
the third length of the via insulating layer along the thickness direction is a half or more of the first length of the light emitting area in the direction along the via insulating layer.

* * * * *